(12) United States Patent
Wang

(10) Patent No.: US 9,992,912 B1
(45) Date of Patent: Jun. 5, 2018

(54) HEAT DISSIPATING DEVICE COMBINED STRUCTURE

(71) Applicant: Chun-Chieh Wang, Taipei (TW)

(72) Inventor: Chun-Chieh Wang, Taipei (TW)

(73) Assignee: LIANCHUN INDUSTRIAL CO., LTD., New Taipei (TW)

( * ) Notice: Subject to any disclaimer, the term of this patent is extended or adjusted under 35 U.S.C. 154(b) by 0 days. days.

(21) Appl. No.: 15/414,564

(22) Filed: Jan. 24, 2017

(51) Int. Cl.
*H01L 23/40* (2006.01)
*H05K 7/20* (2006.01)
*H05K 1/02* (2006.01)

(52) U.S. Cl.
CPC ....... *H05K 7/20409* (2013.01); *H05K 1/0203* (2013.01); *H05K 2201/066* (2013.01); *H05K 2201/10393* (2013.01)

(58) Field of Classification Search
CPC ... H01L 23/40; H05K 7/20409; H05K 1/0203
USPC .......... 361/710, 720; 257/726, 727, 81, 719, 257/718; 165/185
See application file for complete search history.

(56) References Cited

U.S. PATENT DOCUMENTS

| | | | | |
|---|---|---|---|---|
| 5,548,482 A * | 8/1996 | Hatauchi | ............... | H01L 23/367 257/707 |
| 5,945,736 A * | 8/1999 | Rife | .................... | H01L 23/4006 257/706 |
| 7,498,673 B2 * | 3/2009 | Awad | .................. | H01L 23/3675 174/545 |

* cited by examiner

*Primary Examiner* — Dion R Ferguson
*Assistant Examiner* — Mandeep S Buttar
(74) *Attorney, Agent, or Firm* — Che-Yang Chen; Law Offices of Scott Warmuth

(57) ABSTRACT

The present invention provides a heat dissipating device combined structure, which consists of a heat sink and a clasp member. At least one expanded portion extends from the heat sink, and a side extends from each of the two sides of a base of the clasp member to form a conduit. The heat sink and a circuit board are disposed inside the conduit, and at least one ledge portion is formed on the sides. Moreover, a slanting portion extends from and is provided on air foils configured on the sides, and the ends of the slanting portions respectively clasp the expanded portions. Accordingly, the circuit board is mounted on the ledge portions, and electronic components on the circuit board are attached to the bottom portion of the aforementioned heat sink.

5 Claims, 9 Drawing Sheets

HEAT DISSIPATING DEVICE COMBINED STRUCTURE

BACKGROUND OF THE INVENTION (a) Field of the Invention

The present invention relates to a heat dissipating device, and more particularly to a heat dissipating device combined structure that is convenient to disassemble and assemble, able to achieve a stable fastening, and reduces the manufacturing cost.

(b) Description of the Prior Art

Along with the rapid development in the electronic information industry, the processing capacity of electronic components, such as the central processing unit, continuously increases. However, excessive heat energy from the electronic components affects the processing efficiency and serviceable life thereof. Hence, heat conduction components used to effect heat absorption and heat dissipation for the electronic components are generally heat dissipating devices such as a heat sink or a heat conducting plate. However, because the heat dissipating device cannot be directly fixedly disposed to the electronic components, thus, the electronic information industry uses a clasp member to fix the heat sink to the circuit board. For example, Taiwan patent application No. 95106292 discloses a heat sink fastener, which comprises a first fastening member, a second fastening member, and a handle. The first fastening member is provided with a press down spring arm, and one end of the spring arm extends and bends to form a first clasp member; the other end of the spring arm is provided with a joining surface. The second fastening member is disposed on the end of the first fastening member provided with the joining surface. The handle is connected to the second fastening member, and one end of the handle is provided with an an eccentric wheel that presses against the joining surface. A protruding point is formed on the eccentric wheel close to the free end thereof. When the protruding point on the eccentric wheel is rotated, one side of the second fastening member slides to the corresponding other side and the protruding point is mutually clasped to a side edge of the second fastening member. Moreover, when the eccentric wheel is rotated, a turned-over edge is formed on a length of edge in contact with the joining surface, thereby effectively fixing the heat sink to the circuit board. However, disassembling and assembling the clasp member are considerably inconvenient, moreover, the manufacturing cost is also correspondingly increased.

Hence, it is the purpose and the intention of the inventor of the present invention to resolve the difficult technical problems needed to improve the shortcomings of the aforementioned prior art.

SUMMARY OF THE INVENTION

Accordingly, in order to resolve the aforementioned problems, the primary object of the present invention lies in providing a heat dissipating device combined structure that is convenient to disassemble and assemble, able to achieve a stable fastening, and reduces the manufacturing cost.

In order to attain the aforementioned object, the present invention provides a heat dissipating device combined structure, comprising: a heat sink and a clasp member, wherein the heat sink is provided with a bottom portion. A plurality of heat dissipating fins extend from the surface of the bottom portion, and at least one expanded portion extends from sides thereof. The clasp member is provided with a base, and areas on two sides of the base are respectively perpendicularly extended with a side, and a conduit is formed between the two sides. The aforementioned heat sink and a circuit board are disposed inside the conduit, and at least one ledge portion is formed on the sides and extend toward the direction of the conduit. Moreover, a plurality of air foils extend from another end position of the sides relative to the base. A slanting portion is provided on each of the air foils, and each of the end edges of the slanting portions clasp the corresponding expanded portion, thereby enabling the circuit board to be correspondingly disposed between the bottom portion and the base. Furthermore, the bottom surface of the circuit board is correspondingly mounted on the ledge portions, thereby enabling at least one exothermic electronic component on the top surface of the circuit board to be attached the bottom portion of the heat sink, as well fixing the circuit board between the slanting portions and the ledge portions. Accordingly, when the aforementioned heat sink and the circuit board are disposed inside the aforementioned conduit, the circuit board is mounted on the ledge portions, the electronic components on the upper side of the circuit board are attached to the bottom portion of the aforementioned heat sink, and the expanded portions of the heat sink are clasped by the slanting portions, further achieving the effectiveness of convenient disassembling and assembling, stable fastening, and reducing manufacturing cost.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

Figure 1:
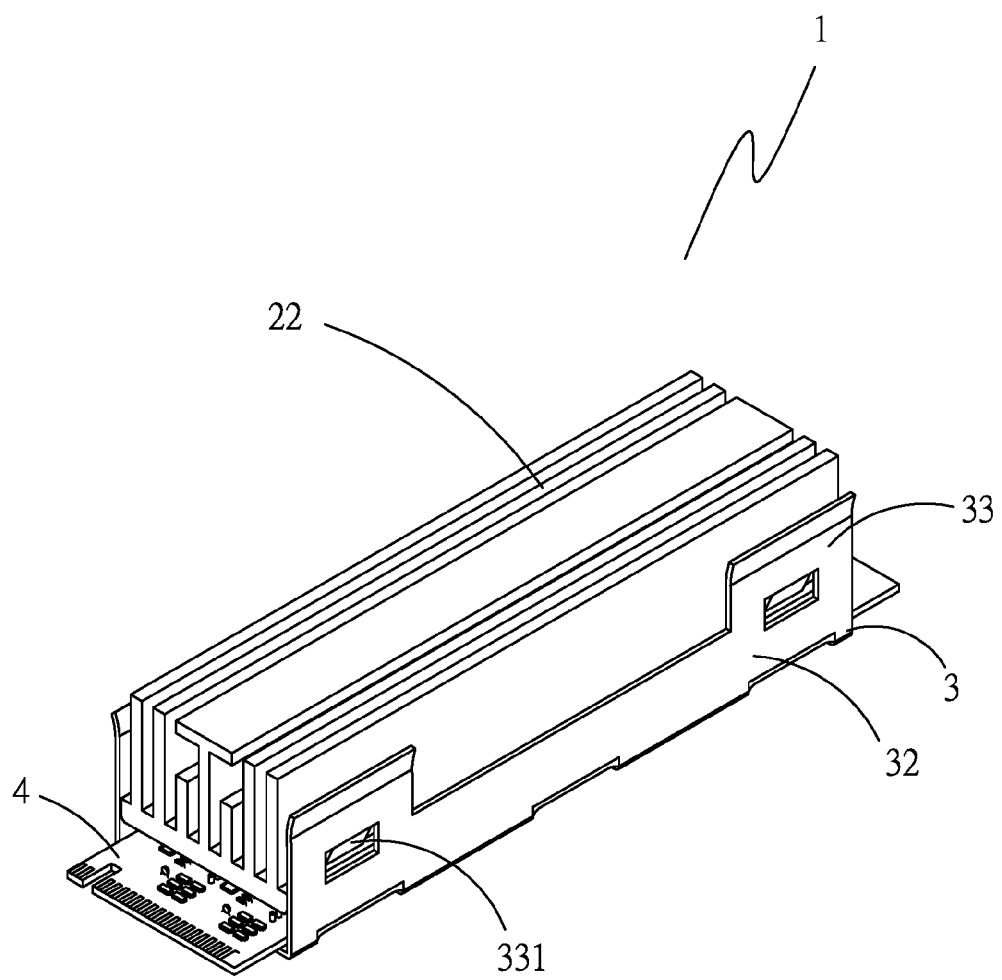
FIG. 1 is an assembled elevational schematic view of a preferred embodiment of the present invention.
Figure 2:
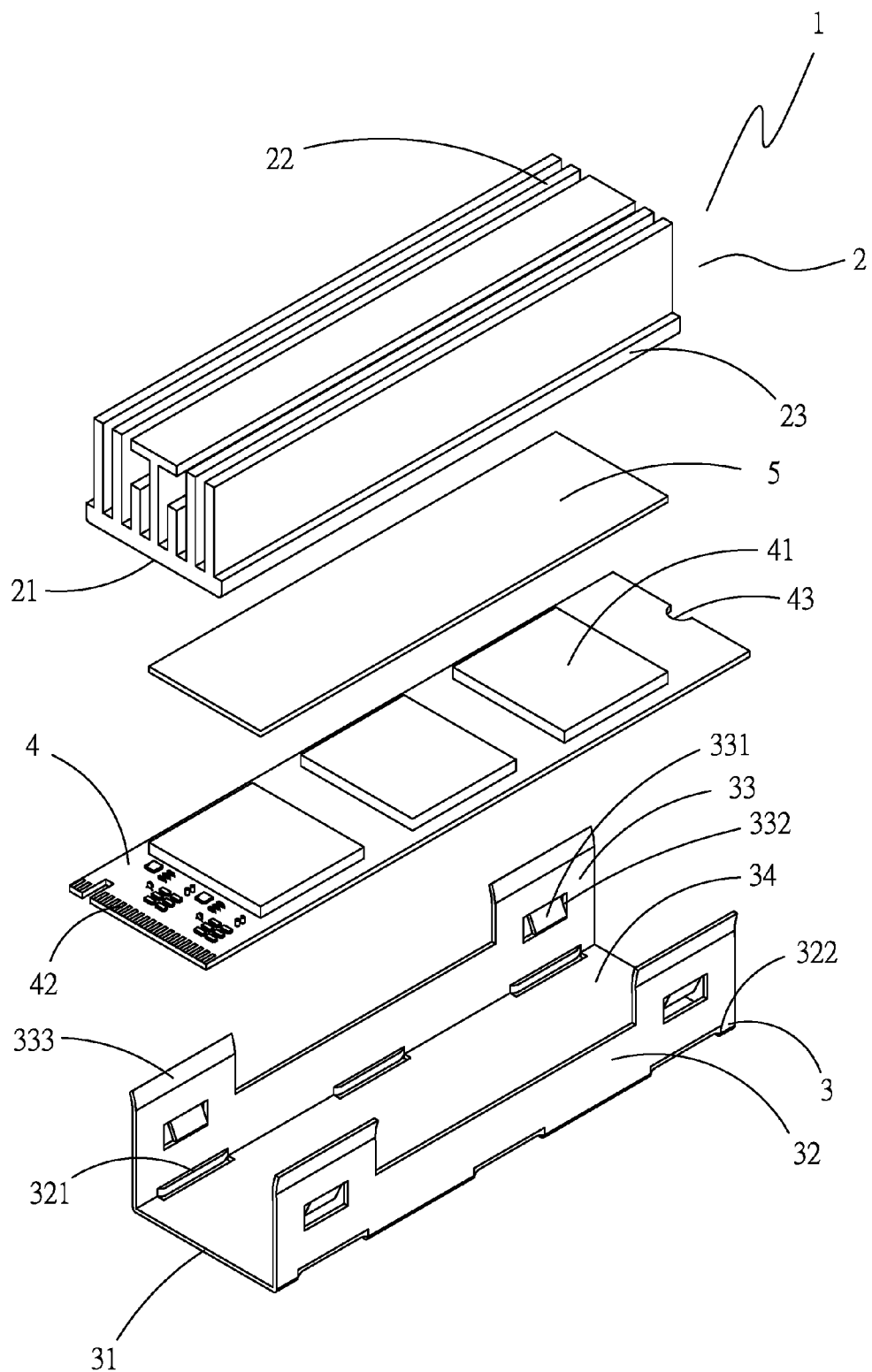
FIG. 2 is an exploded elevational schematic view of the preferred embodiment of the present invention.
Figure 3:
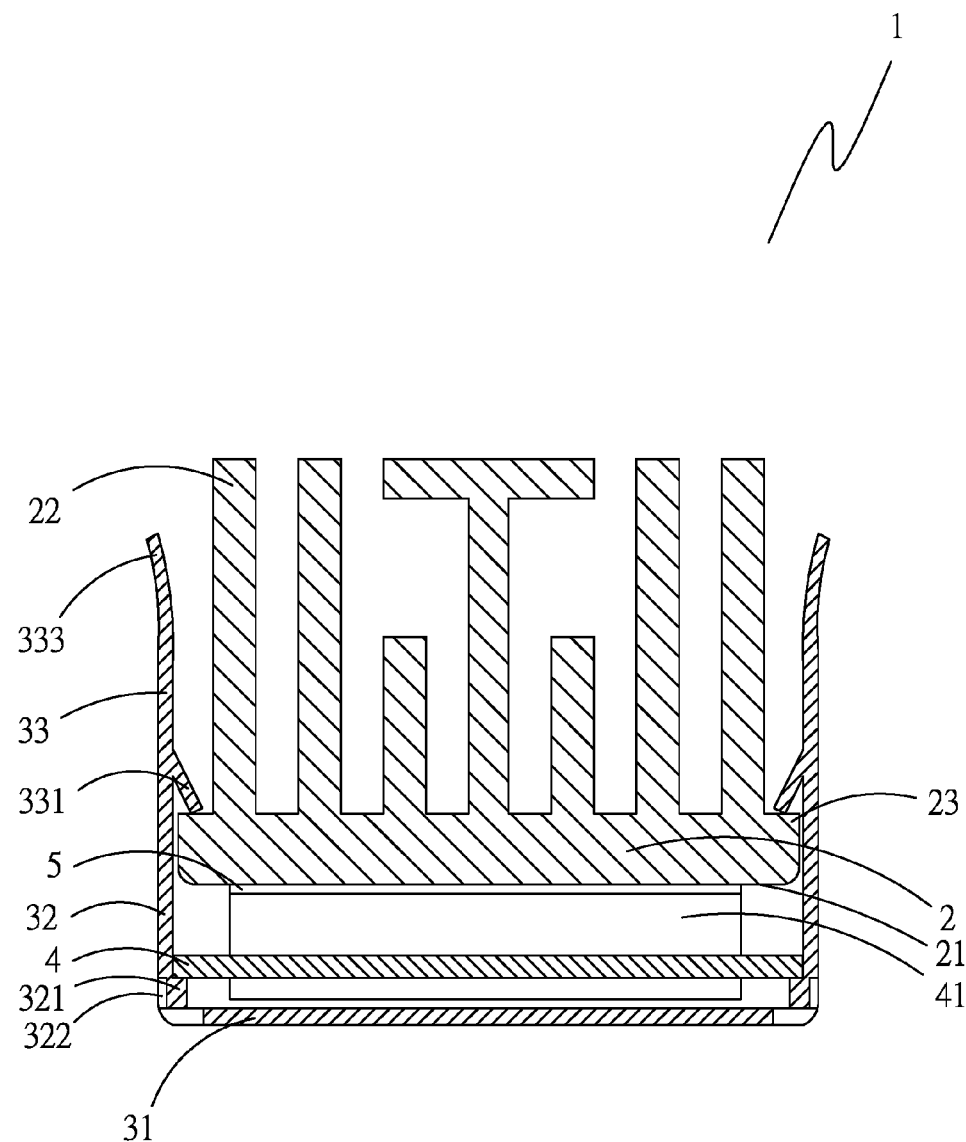
FIG. 3 is an assembled cutaway schematic view of the preferred embodiment of the present invention.
Figure 4:
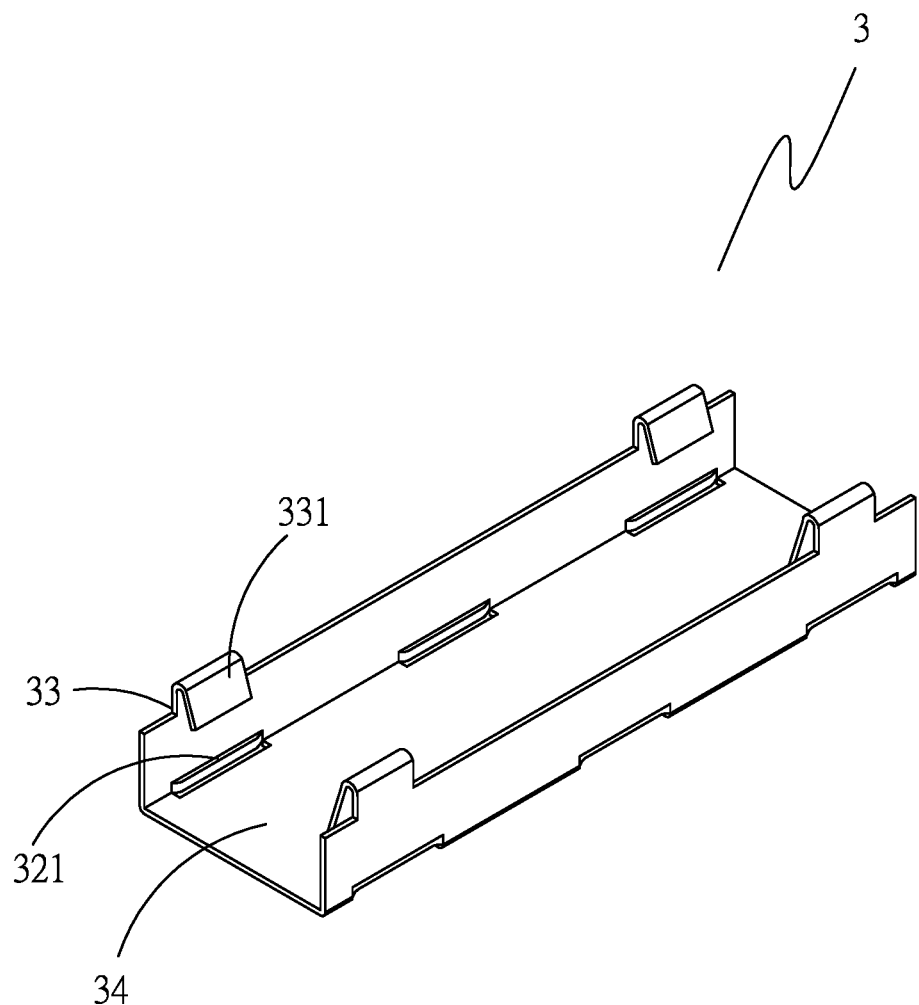
FIG. 4 is a partial elevational schematic view of another preferred embodiment of the present invention.
Figure 5:
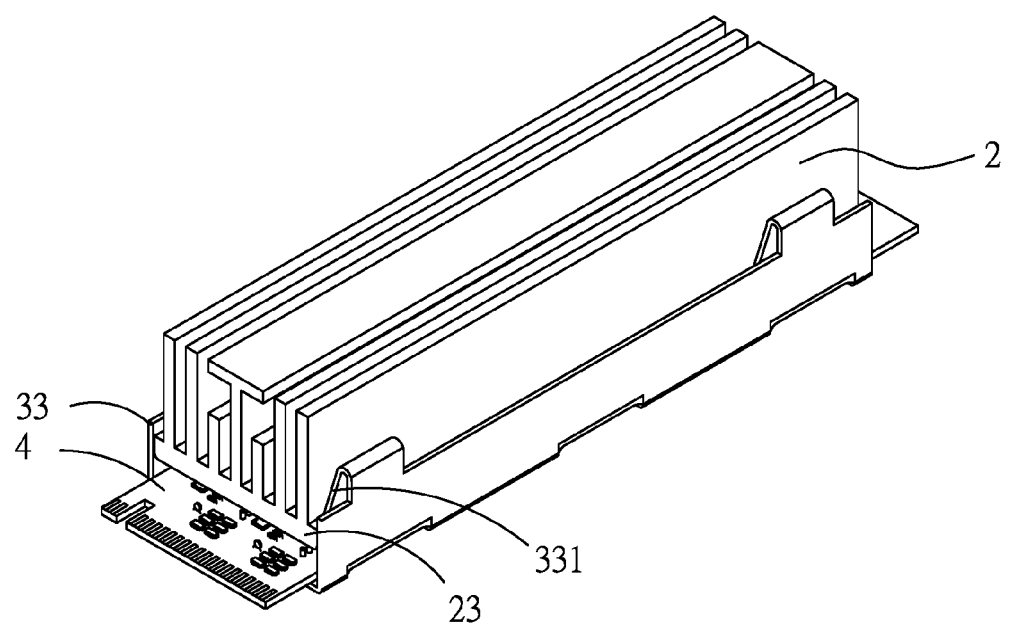
FIG. 5 is an assembled elevational schematic view of the other preferred embodiment of the present invention.
Figure 6:
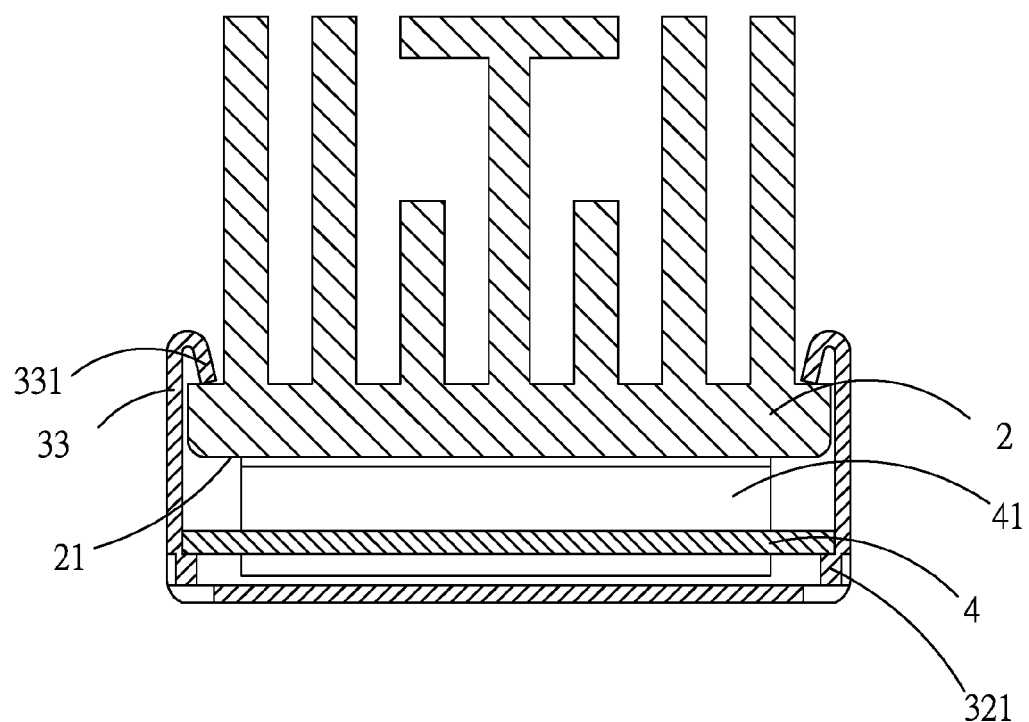
FIG. 6 is an assembled cutaway schematic view of another preferred embodiment of the present invention.
Figure 7:
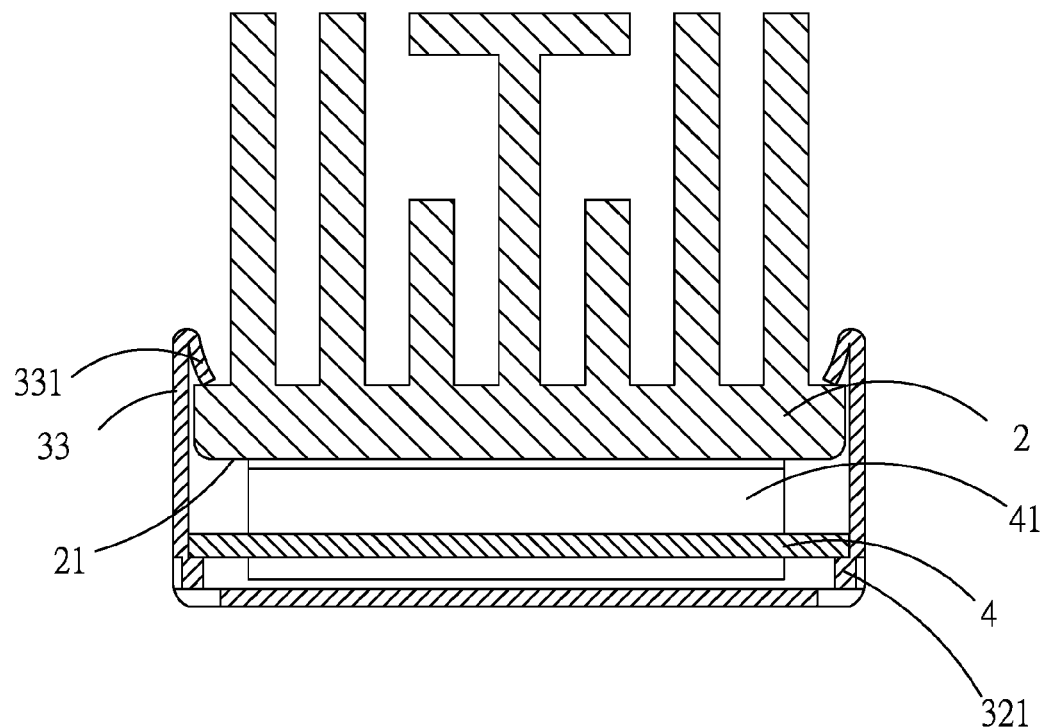
FIG. 7 is a second assembled cutaway schematic view of another preferred embodiment of FIG. 6 of the present invention.

Referring to FIGS. 1 to 3, which show an assembled elevational schematic view, an exploded elevational schematic view, and an assembled cutaway schematic view of a preferred embodiment of the present invention, respectively, and it can be clearly seen from the drawings that a heat dissipating device combined structure 1 comprises a heat sink 2 and a clasp member 3. The heat sink 2 is provided with a bottom portion 21 and a plurality of heat dissipating fins 22, moreover, at least one expanded portion 23 horizontally, outwardly extends from the two sides of the bottom portion 21, and the clasp member 3 is provided with a base 31. Areas on two sides of the base 31 are respectively perpendicularly extended with a side 32, and a conduit 34 is formed between the two sides 32. At least one ledge portion 321 and a side groove 322 are formed on each of the sides 32. The ledge portions 321 respectively integrally extend from the sides of the side grooves 322 and extend toward the direction of the conduit 34. In addition, a plurality of air foils 33 are formed on another end of the sides 32 relative to the base 31. At least one slanting portion 331 extends from each of the air foils 33 and extends towards the direction of the aforementioned conduit 34. Furthermore, a slot hole 332 is formed in each of the air foils 33 at the position of the slanting portion 331, and each of the slanting portions 331 integrally extends from each of the air foils 33 corresponding to the slot hole 332 provided in the corresponding side 32. Furthermore, a guide portion 333 extends and curves upward from the ends of the sides 32 corresponding to the air foils 33. The defined width of the end edge of each of the guide portions 333 on the two sides 32 is greater than the width of the aforementioned conduit 34, and the heat sink 2 and a circuit board 4 are mounted within the conduit 34. Moreover, a heat conducting member 5 is disposed between the circuit board 4 and the heat sink 2, wherein the width between the two expanded portions 23 and the width of the circuit board 4 are identical to the width of the conduit 34, thereby enabling the circuit board 4 and the bottom portion 21 of the heat sink 2 to be conveniently disposed within the conduit 34 using the aforementioned guide portions 333. When the circuit board 4 passes over the slanting portions 331, the circuit board 4 compresses the slanting portions 331 into the slot holes 332, and after the circuit board 4 has passed over the slanting portions 331, the slanting portions 331 return to their original positions, whereupon the circuit board 4 is mounted on top of the ledge portions 321. After disposing the circuit board 4 onto the ledge portions 321, the heat sink 2 is passed over the slanting portions 331, and similarly, the expanded portions 23 of the heat sink 2 compress the slanting portions 331 into the slot holes 332, whereupon the slanting portions 331 return to their original positions after the expanded portions 23 have passed over the slanting portions 331. At which time, the slanting portions 331 correspondingly clasp onto the expanded portions 23, thereby attaching the heat conducting member 5 on the bottom portion 21 of the heat sink 2 to attach to the at least one electronic component 41 on the top surface of the circuit board 4, as well as rigidly fixing the circuit board 4 between the slanting portions 331 and the ledge portions 321. Accordingly, when the aforementioned heat sink 2 and the circuit board 4 are disposed inside the aforementioned conduit 34, the circuit board 4 is mounted on the ledge portions 321, and the expanded portions 23 of the heat sink 2 are clasped by the slanting portions 331, thereby achieving the objective of rigidly fixing a combined structure of the circuit board 4 and the heat sink 2 using the aforementioned clasp member 3, as well as achieving the effectiveness of convenient disassembling and assembling, stable fastening, and reducing the manufacturing cost. In addition, the configuration of the side grooves 322 achieves heat energy convection of heat energy from the exothermic electronic components 41 to increase heat dissipation efficiency of the heat dissipating device combined structure 1. Furthermore, the length of the circuit board 4 is greater than the length of the aforementioned clasp member 3, and the length of the protruding areas of the circuit board 4 are respectively provided with a plurality of electrical contacts 42 and at least one fixing hole 43. The electrical contacts 42 and the fixing hole 43 enable the effectiveness of convenient external electrical connections and fixed positioning, respectively.

Referring further to FIGS. 4 to 7, which show a partial elevational schematic view of another preferred embodiment, an assembled elevational schematic view, and two figures depicting cutaway schematic views of other preferred embodiments of the present invention, respectively, wherein the aforementioned slanting portions 331 respectively integrally extend from end edges of the air foils 33. Moreover, each of the slanting portions 331 are configured at an appropriate separation or formed close to each other between the air foils 33. After the circuit board 4 and the expanded portions 23 have passed over the slanting portions 331, the slanting portions 331 return to their original positions, whereupon the slanting portions 331 correspondingly clasp onto the expanded portions 23. The bottom portion 21 of the heat sink 2 is attached to the electronic components 41, and the circuit board 4 is rigidly fixed between the slanting portions 331 and the ledge portions 321, thereby achieving the objective of rigidly fixing a combined structure of the circuit board 4 and the heat sink 2 using the aforementioned clasp member 3, as well as achieving the effectiveness of convenient disassembling and assembling, stable fastening, and reducing the manufacturing cost.

Figure 8:
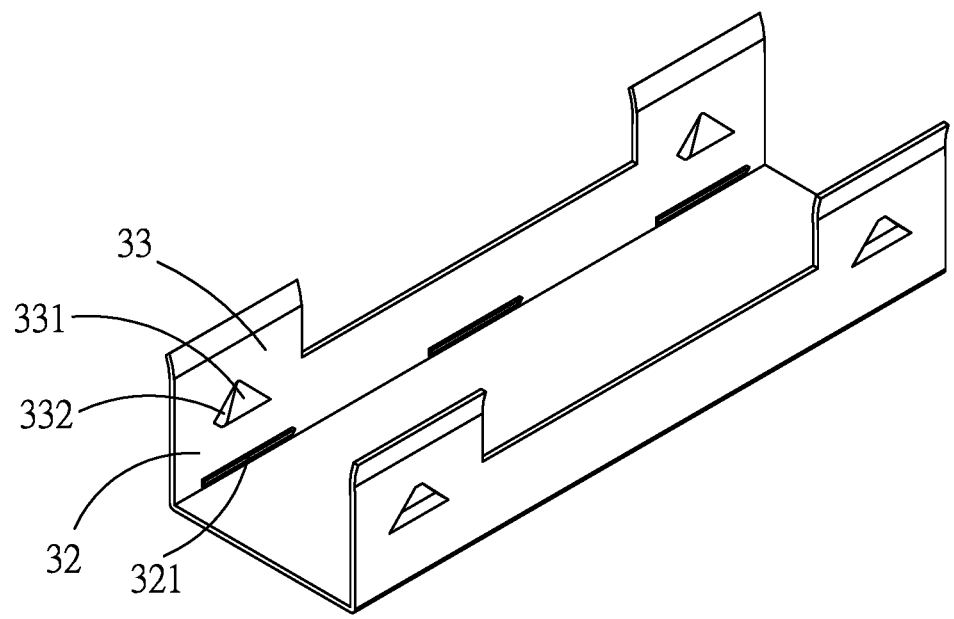
FIG. 8 is a partial elevational schematic view of yet another preferred embodiment of the present invention.

Referring to FIG. 8, which shows a partial elevational schematic view of yet another preferred embodiment of the present invention, wherein the ledge portions 321 are directly formed on the aforementioned sides 32 as an embodiment of the present invention, or the slanting portions 331 are respectively integrally extended from the air foils 33 corresponding to the respective slot hole 332 provided in the position of the respective side 32 as an embodiment of the present invention. When the slanting portions 331 respectively clasp onto the corresponding expanded portions 23, the bottom portion 21 of the heat sink 2 is attached to the at least one electronic component 41 on the top surface of the circuit board 4 (see FIG. 3), and the circuit board 4 is rigidly fixed between the slanting portions 331 and the ledge portions 321.

Figure 9:
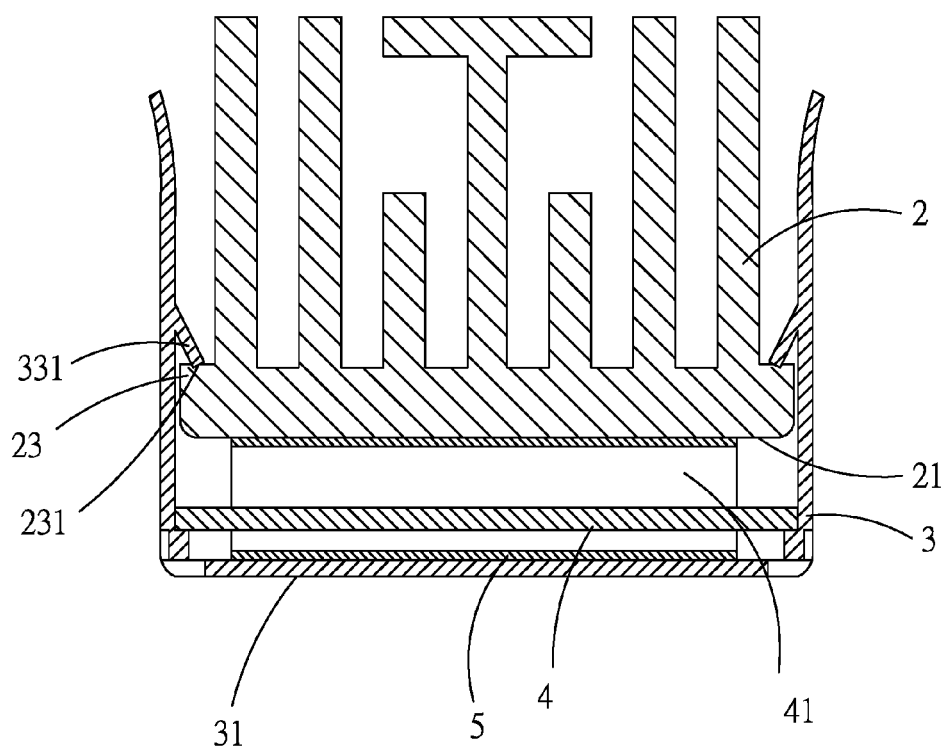
FIG. 9 is a further implementation schematic view of the preferred embodiment of the present invention.

Referring further to FIG. 9, which shows a further implementation schematic view of the preferred embodiment of the present invention, wherein at least one inserting groove 231 is provided on the expanded portions 23 to enable the slanting portions 331 to clasp therein, thereby achieving the objective of rigidly fixing a combined structure of the circuit board 4 and the heat sink 2 using the aforementioned clasp member 3. In addition, the aforementioned exothermic electronic components 41 are mounted on the bottom surface of the circuit board 4, and the aforementioned heat conducting member 5 is disposed between the exothermic electronic components 41 and the base 31, thereby enabling the exothermic electronic components 41 to simultaneously use the clasp member 3 and the heat sink 2 to bring about the effect of conducting heat.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A heat dissipating device combined structure, comprising: a heat sink, the heat sink is provided with a bottom portion, a plurality of heat dissipating fins extend from the surface of the bottom portion, and at least one expanded portion extends from each side of the bottom portion; a clasp member, the clasp member is provided with a base, a side perpendicularly extends from the two sides of the base, a conduit is formed between the two sides, and the conduit enables the heat sink and a circuit board to be disposed therein; at least one ledge portion is configured on each of the sides, and the ledge portions pair with the bottom surface of the circuit board, a plurality of air foils extend from one end of the sides, and a slanting portion extends from each of the air foils to clasp onto the expanded portions; the bottom portion of the heat sink is attached to at least one exothermic electronic component on the top surface of the circuit board, and the circuit board is rigidly fixed between the slanting portions and the ledge portions; and wherein the circuit board and the heat sink are disposed and fixed inside the conduit; the width between the two expanded portions and the width of the circuit board are identical to the width of the conduit and the length of the circuit board is greater than the length of the clasp member; the protruding areas of the circuit board are respectively configured with a plurality of electrical contacts and at least one fixing hole, respectively.

2. The heat dissipating device combined structure according to claim 1, wherein a slot hole is formed in each of the air foils at the position of the slanting portions, each of the slanting portions integrally extend from the respective air foil at the side position of the corresponding slot hole, and each of the slanting portions extends towards the direction of the conduit.

3. The heat dissipating device combined structure according to claim 1, wherein a guide portion extends and curves upward from the ends of the sides corresponding to the air foils, and the defined width of the end edge of each of the guide portions on the two sides is greater than the width of the conduit.

4. The heat dissipating device combined structure according to claim 1, wherein a heat conducting member is disposed on the bottom portion of the heat sink, one side of the heat conducting member is attached to the bottom portion of the heat sink, and at least one exothermic electronic component on the top surface of the circuit board is attached to the other side of the heat conducting member; furthermore, exothermic electronic components are mounted on the bottom surface of the circuit board, and the heat conducting member is disposed between the exothermic electronic components and the base; at least one inserting groove is provided in the expanded portions of the heat sink to enable the slanting portions to clasp therein.

5. The heat dissipating device combined structure according to claim 1, wherein a side groove is formed in the sides of the base corresponding to the areas of the ledge portions, and each of the ledge portions respectively integrally extend from the sides of the side grooves.

* * * * *